United States Patent
Yang et al.

(10) Patent No.: US 6,835,641 B1
(45) Date of Patent: Dec. 28, 2004

(54) METHOD OF FORMING SINGLE SIDED CONDUCTOR AND SEMICONDUCTOR DEVICE HAVING THE SAME

(75) Inventors: Sweehan J. H. Yang, Tainan (TW); Chen-Chou Huang, Tainan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/835,010

(22) Filed: Apr. 30, 2004

(51) Int. Cl.⁷ ............................................. H01L 21/44
(52) U.S. Cl. ...................... 438/597; 438/584; 438/386; 438/244; 438/243
(58) Field of Search ............................... 438/597, 584, 438/386, 244, 243

(56) References Cited

U.S. PATENT DOCUMENTS

| | | | |
|---|---|---|---|
| 6,348,374 B1 * | 2/2002 | Athavale et al. | 438/243 |
| 6,365,465 B1 * | 4/2002 | Chan et al. | 438/283 |
| 6,518,118 B2 * | 2/2003 | Athavale et al. | 438/243 |
| 6,639,264 B1 * | 10/2003 | Loh | 257/301 |
| 2002/0130346 A1 * | 9/2002 | Athavale et al. | 257/301 |

* cited by examiner

*Primary Examiner*—Matthew Smith
*Assistant Examiner*—Victor V Yevsikov
(74) *Attorney, Agent, or Firm*—Birch, Stewart, Kolasch & Birch, LLP

(57) ABSTRACT

A method of forming a single sided conductor and a semiconductor device having the same is provided. The method includes providing a substrate having an opening. The opening exposes a sidewall and an opening base surface. A single sided silicon layer adjacent to the sidewall in the opening. The single sided silicon layer exposes a portion of the opening base surface. The single sided silicon layer is implanted with fluorine-containing ions. The substrate and the single sided silicon layer is thermally oxidized to form a thermal oxide layer in the opening.

12 Claims, 3 Drawing Sheets

METHOD OF FORMING SINGLE SIDED CONDUCTOR AND SEMICONDUCTOR DEVICE HAVING THE SAME

FIELD OF INVENTION

The present invention generally relates to a method of forming a semiconductor device, and more particularly, to a method of forming a single sided conductor of a semiconductor device by implementing ion implantation and thermal oxidation processes.

BACKGROUND OF THE INVENTION

The formation of semiconductor devices often requires processing on one side of a trench. For example, this may involve an isolation structure of dielectric layer or a conductive structure on one side of the trench, whereas the other side of the trench remains unchanged. However, as the feature size of the semiconductor device shrinks, the use of lithography technique to define the single sided conductor becomes difficult to control, or even fails to comply with the need of practical applications. Therefore, to form a sub-lithographic single sided conductor without using any extra lithography process is an advance development.

A conventional single sided conductor is generally formed by filling the trench with a conductive layer and patterning the conductive layer to form an opening on its side, that will be filled with dielectric layer in subsequent processes to achieve single sided isolation. Generally, a deposition process of dielectric is utilized to fill the opening. However, as the feature size of device shrinks, the aspect ratio of the opening is increased so that the filling ability of the deposition process is reduced resulting in voids in the deposited dielectric layer. Therefore, the effective dielectric constant of the deposited dielectric layer is significantly reduced, which accordingly influences the reliability of the device and the production yield.

Therefore, it is desired to provide a method of forming a single sided conductor without using extra lithography processes.

SUMMARY OF THE INVENTION

One aspect of the present invention is to provide a method of forming a single sided conductor, which can be a sub-lithographic feature without implementing extra lithography processes.

Another aspect of the present invention is to provide a method of forming a single sided conductor by implementing ion implantation process to enhance thermal oxidation so as to eliminate voids induced by deposition processes of filling the high aspect ratio opening.

In one embodiment, the present invention provides a method of forming a single sided conductor including providing a substrate. The substrate has an opening, which exposes a sidewall and an opening base surface. A single sided silicon layer is formed adjacent to the sidewall in the opening to expose a portion of the opening base surface. Then, the single sided silicon layer is implanted with fluorine-containing ions and thermally oxidized to form a thermal oxide layer in the opening.

Moreover, the step of forming the single sided silicon layer includes forming a silicon layer in the opening; removing a portion of the silicon layer to form a recess; forming a dielectric layer in the recess; forming a conformal polysilicon layer on the dielectric layer; ion implanting the conformal polysilicon layer to form an implanted polysilicon layer and reserve an unimplanted polysilicon layer; removing the unimplanted polysilicon layer, the dielectric layer and the silicon layer thereunder; and removing the remaining dielectric layer so as to form the single sided silicon layer. Furthermore, the step of implanting fluorine-containing ions includes implanting fluorine ions (F) or boron fluoride ions ($BF_2^+$) with a doping concentration of about $1 \times 10^{13} \sim 1 \times 10^{16}$ ions/cm$^2$ at an implantation angle of about 10 to 30° and an energy of about 5 to 20 KeV.

A further aspect of the present invention is to provide a method of forming a semiconductor device having a single sided conductor, such as a trench capacitor, which integrates ion implantation and thermal oxidation processes with the current process flow instead of deposition processes.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

The present invention discloses a method of forming a single sided conductor and a semiconductor device having the single sided conductor, which utilizes ion implantation and thermal oxidation processes to form a thermal oxide layer with improved effective dielectric constant due to the elimination of voids induced by deposition processes. FIGS. 1 to 6 illustrate preferred embodiments of the present invention.

Figure 1:
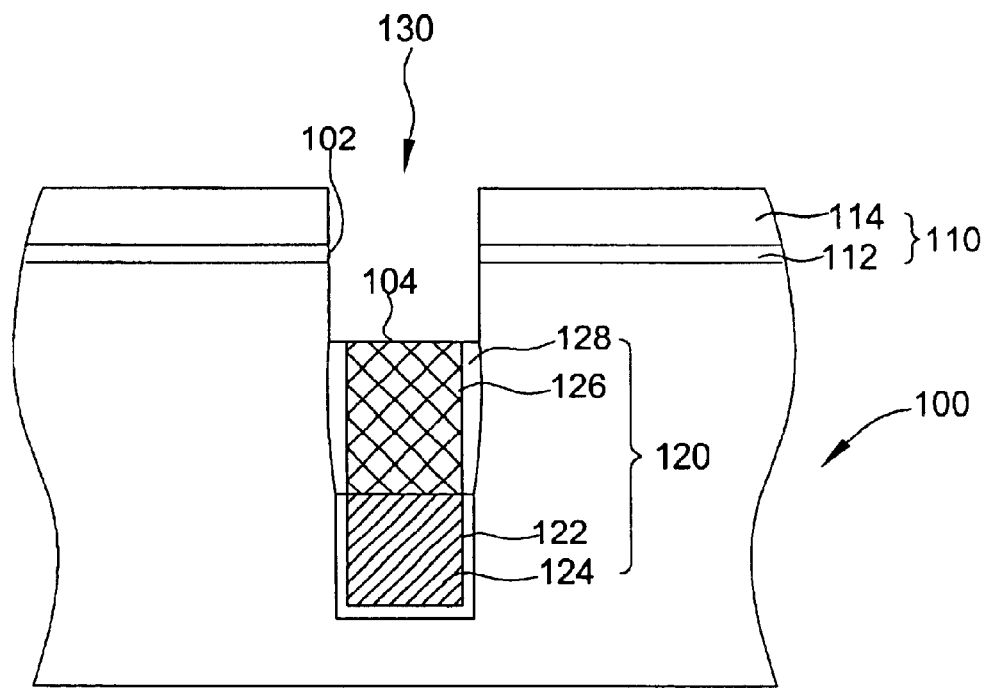
FIGS. 1 to 6 illustrate cross-sectional views of forming a single sided conductor in one embodiment of the present invention.

In one embodiment, the present invention provides a method of forming a single sided conductor. The present invention can be applied to the manufacture of any semiconductor device in need of single sided conductor, for example, a single sided buried strap of a capacitor or a vertical transistor, but not limited thereto. Referring to FIG. 1, in this embodiment, the present invention provides a method of forming a single sided conductor for manufacturing a semiconductor device. The method includes a step of providing a substrate 100, such as a silicon substrate or a semiconductor wafer at any stage of manufacture. The substrate 100 can also has a pad dielectric layer 110 thereon, a storage node 120 therein, and an opening 130 etched therein. The opening 130 exposes a sidewall 102, and an opening base surface 104. In this embodiment, the opening base surface 104 can be a surface of the storage node 120. The pad dielectric layer 110 includes a pad oxide layer 112 and a pad nitride layer 114, which can be formed by conventional deposition processes and act as a hard mask in subsequent processes. The storage node 120 can be a trench capacitor, which is formed in the semiconductor substrate 100 by conventional processes, such as lithography, etch, deposition, oxidation, etc. The storage node 120 includes a capacitor dielectric layer 122, such as an oxide layer, a nitride layer or the combination thereof, a capacitor conductor 124, such as a polysilicon layer, and other layers formed thereon, such as a conductive plug 126 and a collar dielectric layer 128. The layers of storage node 120 can be formed by conventional lithography, etch, deposition, oxidation, etc, and not elaborated hereinafter.

Figure 2:
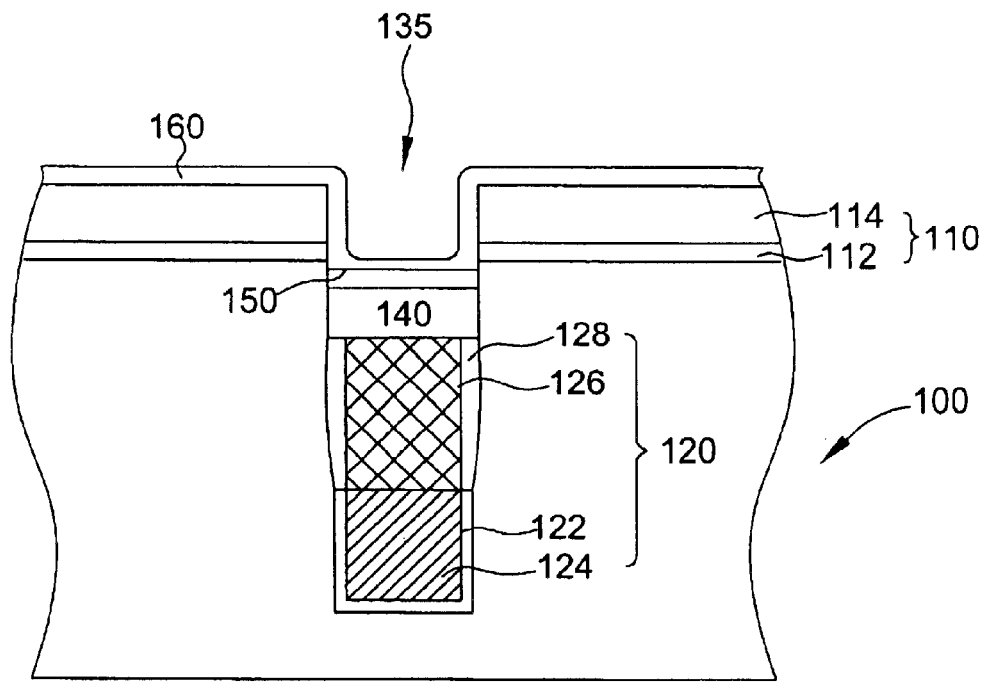
Figure 5:
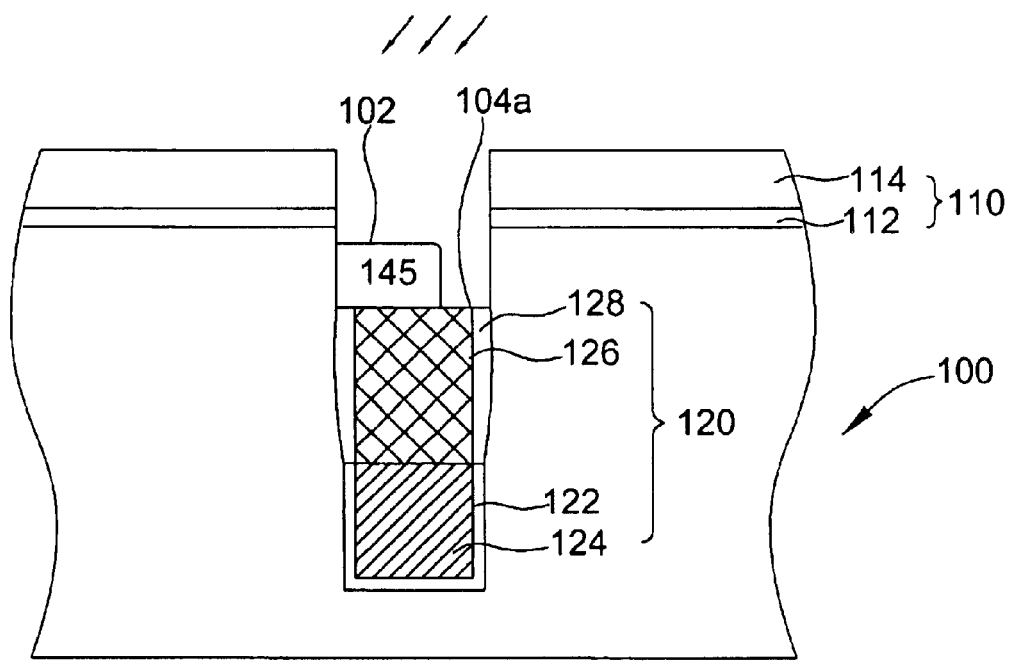

Then, a single sided silicon layer 145 is formed in the opening 130. The single sided silicon layer 145 is adjacent to the sidewall 102 and exposes a portion of the opening bases surface (i.e. the surface portion 104a of the storage node 120, as shown in FIG. 5). Referring to FIG. 2, the step of forming the single sided silicon layer 145 includes forming a silicon layer 140 in the opening 130. The silicon layer 140 can be a polysilicon layer filling the opening 130 by deposition techniques. Then, a portion of the silicon layer is removed to form a recess 135. The recess 135 can be formed by etching back the silicon layer 140 or chemical mechanical polishing processes. Then, a dielectric layer 150 is formed in the recesses 135. The dielectric layer 150 is formed of a material with an etching selectivity over the silicon layer 140 or polysilicon layer. The dielectric layer 150 can be an oxide layer formed by conventional deposition, etching, or chemical mechanical polishing processes. Then, a conformal polysilicon layer 160 is formed on the dielectric layer 150. For example, an intrinsic polysilicon layer is conformally deposited over the entire substrate 100 by chemical vapor deposition process.

Figure 3:
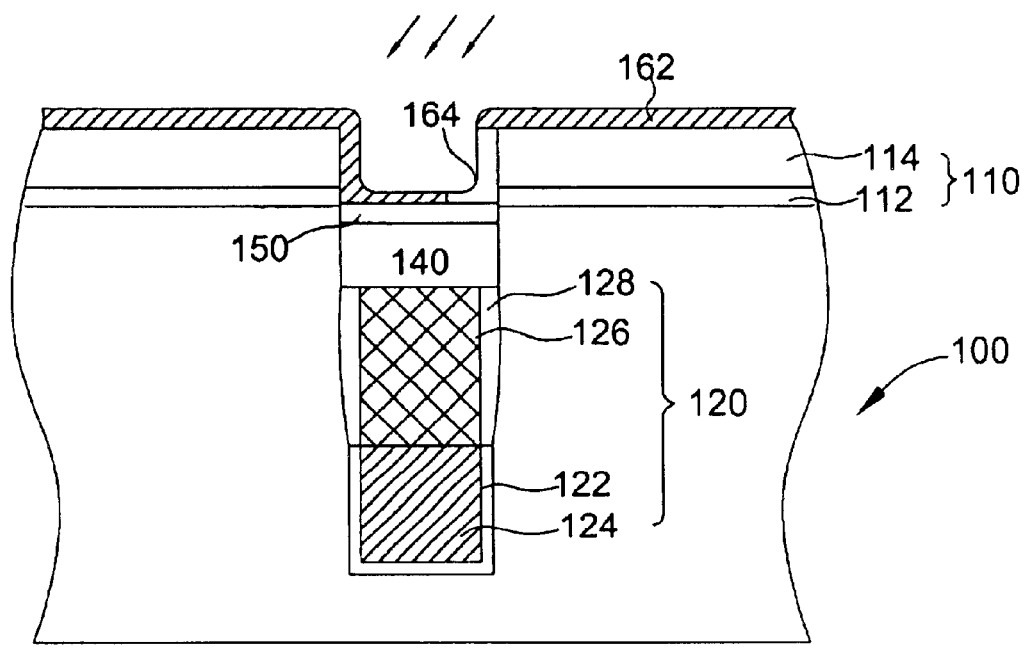
Figure 4:
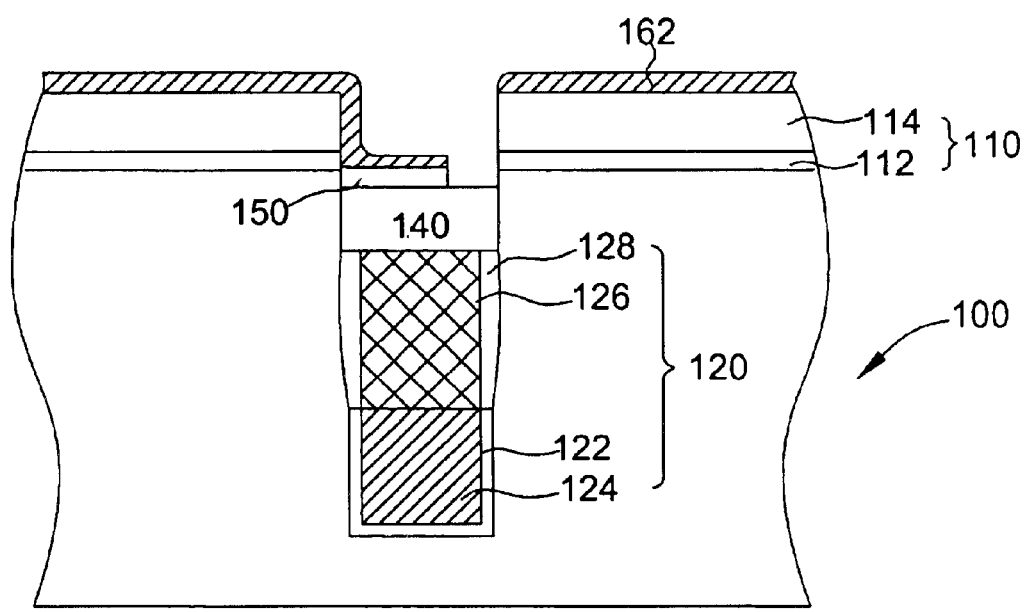

As shown in FIG. 3, the conformal polysilicon layer 160 is partially ion implanted to form an implanted polysilicon layer 162 and reserve an unimplanted polysilicon layer 164. For example, angled ion implantation is performed on the conformal intrinsic polysilicon layer 160 so that the unimplanted polysilicon layer 164 is reserved due to the topography of the substrate 100. Then, the unimplanted polysilicon layer 164 and the dielectric layer 150 thereunder are removed by using the implanted polysilicon layer 162 as a mask. In other words, the etching characteristics of the implanted polysilicon layer 162 and the unimplanted polysilicon layer 164 are different, and therefore, the unimplanted polysilicon layer 164 can be selectively etched to expose a portion of the dielectric layer 150. Moreover, due to the etching selectivity between the dielectric layer 150 and the implanted polysilicon layer 162, the exposed dielectric layer 150 can be selectively removed to expose a portion of the silicon layer 140, as shown in FIG. 4.

Figure 6:
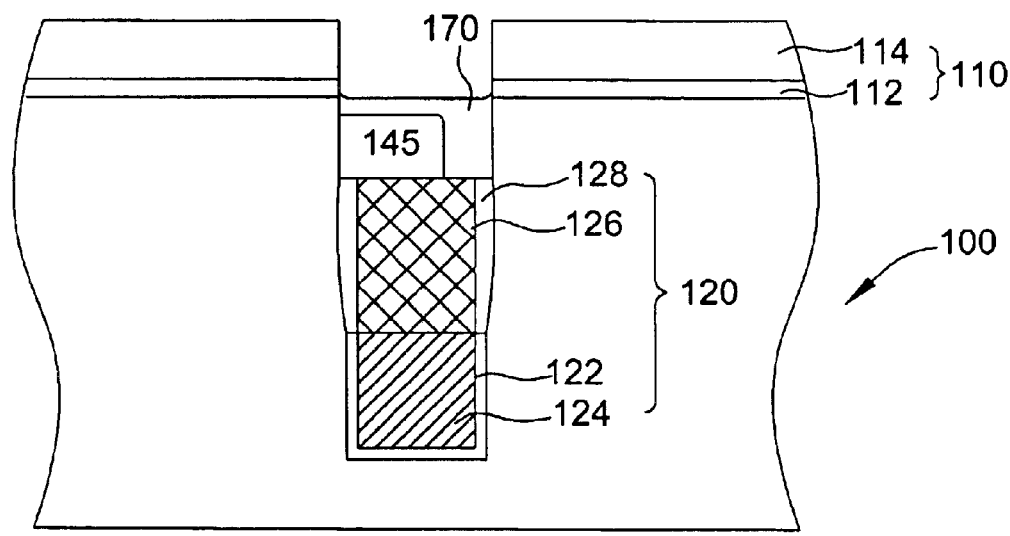

As shown in FIG. 5, the implanted polysilicon layer 162 and the exposed silicon layer 140 are removed by using the dielectric layer 150 as a mask. Then, the remaining dielectric layer 150 is removed. Therefore, the single sided silicon layer 145 is formed, which is adjacent to the sidewall 102 and exposes a portion of surface 104a of the storage node 120. The single sided silicon layer 145 is implanted with fluorine-containing ions, such as fluorine ions ($F^-$) or boron fluoride ions ($BF_2^+$), resulting in a doping concentration of about $1\times10^{13}$~$1\times10^{16}$ ions/cm$^2$. The ion implantation is performed at an angle of about 10 to 30° and an energy of about 5 to 20 KeV. Then, the substrate 100 and the single sided silicon layer 145 are thermally oxidized to form a thermal oxide layer 170 in the recess 135, as shown in FIG. 6.

It is noted that the implantation of fluorine-containing ions will enhance the oxidation of the silicon-containing materials to achieve a thicker oxide layer. Moreover, the oxidation process can be integrated with the current process flow of active area thermal oxidation process. Therefore, as the feature size of device shrinks and deposition processes encounter problems of filling high aspect ratio opening, the present invention implements ion implantation and thermal oxidation processes to improve the effective dielectric constant of the single sided dielectric layer due to the reduction of voids. Furthermore, though a method of forming a capacitor device is illustrated in the embodiment of the present invention, any semiconductor device in need of a single sided conductor can be formed by the present invention.

Although specific embodiments have been illustrated and described, it will be obvious to those skilled in the art that various modifications may be made without departing from what is intended to be limited solely by the appended claims.

What is claimed is:

1. A method of forming a single sided conductor, comprising:

providing a substrate having an opening exposing a sidewall and an opening base surface;

forming a single sided silicon layer adjacent to said sidewall in said opening, said single sided silicon layer exposing a portion of said opening base surface; and implanting fluorine-containing ions into said single sided silicon layer; and thermally oxidizing said substrate and said single sided silicon layer to form a thermal oxide layer in said opening.

2. The method of claim 1, wherein said substrate comprises a silicon substrate.

3. The method of claim 1, wherein said step of forming said single sided silicon layer comprises:

forming a silicon layer in said opening;

removing a portion of said silicon layer to form a recess;

forming a dielectric layer in said recess;

forming a conformal polysilicon layer on said dielectric layer;

ion implanting said conformal polysilicon layer to form an implanted polysilicon layer and reserve an unimplanted polysilicon layer;

removing said unimplanted polysilicon layer and said dielectric layer thereunder;

removing said implanted polysilicon layer and said silicon layer, the latter by using said dielectric layer as a mask; and removing said dielectric layer.

4. The method of claim 1, wherein said step of implanting fluorine-containing ions comprises implanting fluorine ions ($F^-$) or boron fluoride ions ($BF_2^+$).

5. The method of claim 4, wherein said fluorine-containing ions has a doping concentration of about $1\times10^{13}$~$1\times10^{16}$ ions/cm$^2$.

6. The method of claim 1, wherein said step of implanting is performed at an implantation angle of about 10 to 30°.

7. The method of claim 1, wherein said step of implanting is performed at an energy of about 5 to 20 KeV.

8. A method of forming a semiconductor device having a single sided conductor, comprising:

providing a semiconductor substrate having a pad dielectric thereon, a storage node therein, and an opening etched therein, said opening exposing a sidewall and an opening base surface;

forming a silicon layer in said opening;

removing a portion of said silicon layer to form a recess;

forming a dielectric layer in said recess;

forming a conformal polysilicon layer on said dielectric layer;

ion implanting said conformal polysilicon layer to form an implanted polysilicon layer and reserve an unimplanted polysilicon layer;

removing said unimplanted polysilicon layer and said dielectric layer thereunder;

removing said implanted polysilicon layer and said silicon layer, the latter by using said dielectric layer as a mask;

removing said dielectric layer to form a single sided silicon layer;

implanting fluorine-containing ions into said single sided silicon layer; and thermally oxidizing said semiconductor substrate and said single sided silicon layer to form a thermal oxide layer in said opening.

9. The method of claim 8, wherein said step of implanting fluorine-containing ions comprises implanting fluorine ions ($F^-$) or boron fluoride ions ($BF_2^+$).

10. The method of claim 9, wherein said fluorine-containing ions has a doping concentration of about $1\times10^{13} \sim 1\times10^{16}$ ions/cm$^2$.

11. The method of claim 8, wherein said step of implanting is performed at an implantation angle of about 10 to 30°.

12. The method of claim 8, wherein said step of implanting is performed at an energy of about 5 to 20 KeV.

* * * * *